United States Patent [19]

Forrest et al.

[11] Patent Number: 4,511,445
[45] Date of Patent: Apr. 16, 1985

[54] PROCESS OF ENHANCING CONDUCTIVITY OF MATERIAL

[75] Inventors: Stephen R. Forrest, Chatham; Martin L. Kaplan, Morris Plains; Paul H. Schmidt, Chatham; Thirumalai N. C. Venkatesan, Bridgewater, all of N.J.

[73] Assignee: AT&T Bell Laboratories, Murray Hill, N.J.

[21] Appl. No.: 389,776

[22] Filed: Jun. 18, 1982

[51] Int. Cl.$^3$ .................. B01J 19/08; H01L 29/28
[52] U.S. Cl. .................. 204/158 HE; 204/157.1 H; 430/270
[58] Field of Search .................. 204/158 HE, 157.1 H; 430/270, 296

[56] References Cited

U.S. PATENT DOCUMENTS

| | | | |
|---|---|---|---|
| 3,123,511 | 3/1964 | Coleman | 204/158 HE |
| 4,312,935 | 1/1982 | Engler | 430/270 |
| 4,316,385 | 2/1982 | De Vries et al. | 73/104 |
| 4,329,418 | 5/1982 | Kny et al. | 430/270 |

OTHER PUBLICATIONS

Kaplan et al, Applied Physics Letters, vol. 36(10), May 1980, pp. 867–869.
Schmidt et al, Applied Physics Letters, vol. 40(1), (Jan. 1982), pp. 93–95.
Sichel et al, Solid State Communications, vol. 41(10), (1982), pp. 747–749.
Walker, Chemistry & Physics of Carbon, vol. 16, pp. 193–199.
Hashimoto et al, "A New Photomask with Ion-Implanted Resist", pp. 198–201.
Iida et al, Journal of Applied Physics (Japan), vol. 16, No. 8, (Aug. 1977), pp. 1313–1318.

Primary Examiner—Howard S. Williams
Attorney, Agent, or Firm—James Hoppes Fox; Irwin Ostroff

[57] ABSTRACT

The conductivity of a wide range of carbon-containing materials is substantially increased by irradiation with particles having an atomic mass of at least 1. Both polymeric and nonpolymeric, organic and inorganic, materials can be used. The particulate irradiation, for example an ion beam, substantially breaks down the material to a form that includes amorphous carbon having unusually high conductivity. Resistivities of less than $10^{-3}$ ohm-cm are possible. When applied as a film on a substrate, the irradiated material can be used for device interconnects. Conducting lines can be produced in the film, as well as vertical contacts through the film.

12 Claims, 2 Drawing Figures

PROCESS OF ENHANCING CONDUCTIVITY OF MATERIAL

BACKGROUND OF THE INVENTION

1. Field of the Invention

This invention relates to a method of obtaining increased conductivity in a material, and the increased conductivity material obtained thereby, suitable for use as a circuit element in a wide variety of electrical and electronic applications.

2. Description of the Prior Art

Conductors used in electrical and electronic applications often comprise a metallic element surrounded by a plastic or other organic insulating material. In the case of integrated circuits and other semiconductor devices, electrical conductors typically comprise metallic lines surrounded by an inorganic insulating material, for example silicon dioxide, or comprise heavily doped polysilicon material surrounded by more lightly doped silicon or silicon dioxide, etc. Recently, silicides—that is, silicon-metal compounds—have been increasingly used for obtaining reduced resistivities that aid in the performance of electronic circuits.

Most of the prior art conductors have comprised inorganic materials, as seen from the above examples. However, work has also been recently aimed at obtaining high conductivity materials from organic materials. For example, carbon-containing films have been pyrolized to produce films having a relatively high conductivity; see "Carbon Films With Relatively High Conductivity," by M. L. Kaplan et al, Applied Physics Letters, Vol. 36, pages 867–869 (1980). The resulting films were highly conductive, having a room temperature conductivity of about 250 (ohm-cm)$^{-1}$; that is, a resistivity of about 0.004 ohm-cm. They had either metallic or semiconducting behavior, depending on the preparation temperature.

It is typically desirable in electronic applications to obtain relatively fine-line conducting regions surrounded by an insulating region; for example, conductors that are used on circuit boards or to connect areas of integrated circuits. Therefore, a selective method of treating organic material to obtain high conductivity is desirable. Electron beams have been used to irradiate certain organic materials to obtain increased conductivity; see "Electron Beam Pattern Generation in Thin Film Organic Dianhydrides," by P. H. Schmidt et al, Applied Physics Letters, Vol. 40, pages 93–95 (1982). While the conductivity of the irradiated regions was substantially increased as compared to the nonirradiated regions, the highest conductivities obtained were only on the order of 1 (ohm-cm)$^{-1}$ for the material PTCDA. In numerous electrical and electronic applications, it is desirable or necessary to have substantially higher conductivity; that is, a resistivity substantially less than 1 ohm-cm.

SUMMARY OF THE INVENTION

We have invented a method of obtaining low resistivity material by irradiating carbon-containing materials with particles having an atomic weight of at least 1. Selective radiation can provide for conducting regions surrounded by substantially nonconducting regions of the material. The carbon-containing material is typically in the form of a film applied to a substrate, and can be either a polymeric or nonpolymeric carbon-containing material, typically an organic compound. Prior to irradiation, the resistivity of the material is greater than 1 ohm-cm, and typically greater than $10^{10}$ ohm-cm. The particle irradiation is typically in the form of an ion beam, with other particles being possible. The particles break down the material to a form that includes substantially amorphous carbon having increased conductivity. The irradiation produces resistivities of typically less than $10^{-1}$ ohm-cm in the material, with resistivities less than $10^{-2}$ ohm-cm being possible in many cases. The resulting material is suitable for conducting electrons from one portion of a device, circuit, or apparatus to another.

DETAILED DESCRIPTION

The following detailed description refers to obtaining increased conductivity (i.e., reduced resistivity) regions in carbon-containing materials by means of particulate irradiation. The irradiated regions are adapted for use for the conduction of electrons. This conduction of electrons is typically from one portion of an electrical or electronic device, circuit, or apparatus to another portion of the same, or another, device, circuit, or apparatus. This invention is related to our discovery that a wide range of carbon-containing materials, both polymeric and nonpolymeric, shows a substantial increase in conductivity (that is, a decrease in resistivity) when irradiated with ions. The material that remains after the irradiation comprises amorphous-like carbon in a highly conducting state. However, other components of the original material, for example metals or nitrogen, can also remain in the irradiated material without apparent degradation of the conduction mechanism. While ion irradiation is discussed below, it is to be understood that electrically neutral particles (e.g., atoms and molecules) produce in most cases substantially similar results as the corresponding ion having comparable kinetic energy, and are included herein.

In Example 1 below, conducting patterns are generated in thin films of the aromatic compounds 3,4,9,10-perylenetetracarboxylic dianhydride (PTCDA); 1,4,5,8-napthalenetetracarboxylic dianhydride (NTCDA); and in Ni phthalocyanine (NiPc). The resistivity is typically reduced by 13 orders of magnitude compared with that obtained for nonirradiated films. For example, the room temperature resistivity ($\rho$) of PTCDA changes from $\rho \geq 10^{10}$ ohm-cm in its as-deposited state to $\rho = 7 \times 10^{-4}$ ohm-cm at a 2 MeV Ar$^+$ dose of D=$10^{17}$ ions/cm$^2$, for the films exposed as below. Prior to irradiation, films 1,000–3,000 Angstroms thick were deposited on glass substrates by vacuum sublimation. These films were found to be polycrystalline using X-ray and electron diffraction techniques. The separate grains of the film were between 100 Angstroms and 500 Angstroms in diameter.

EXAMPLE 1

Irradiation of the films was done using 2 MeV Ar$^+$ ions from a Van De Graaf generator. The beam, about 1 mm in diameter, was incident on the sample through a 0.1×1.0 cm slit in a shadow mask. Uniform exposures were obtained by raster scanning the beam over the mask, thereby uniformly exposing the sample. The films were initially irradiated to improve adhesion to the substrate with a low dose of $10^{13}$ ions/cm$^2$ at low beam currents (10 nA) before commencing a high dose irradiation at convenient currents of a few hundred nA. A typical sample then had several irradiated stripes with the ion dose varying from $10^{14}$ cm$^{-2}$ to $10^{17}$ cm$^{-2}$.

Figure 1:
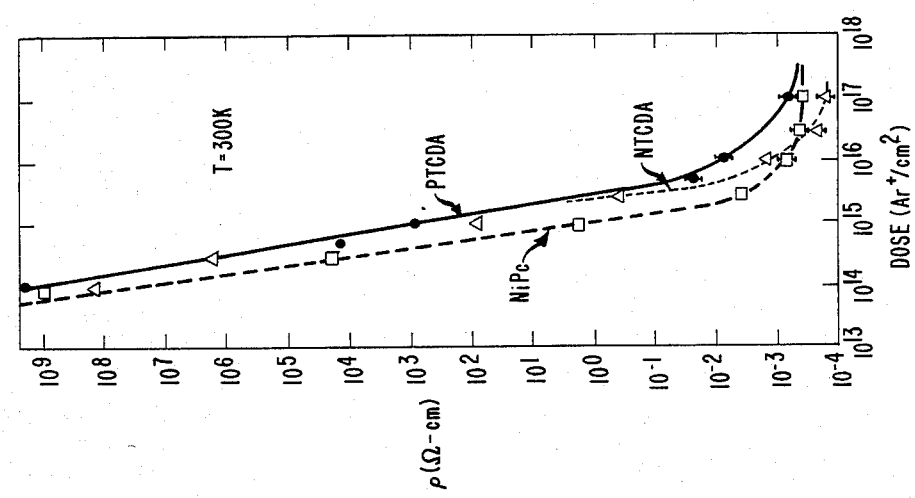
FIG. 1 shows the room temperature resistivity versus ion dose for certain nonpolymeric organic materials.

The resistivity of highly irradiated ($D > 5 \times 10^{14}$ cm$^{-2}$) samples was determined using four point measurements, whereas at lower doses (and therefore higher resistivities), the resistance was measured using only a two point probe. Voltage drops were measured across a distance of 0.1–0.2 cm. We find ohmic behavior for samples irradiated at $D \geq 10^{14}$ cm$-2$ using measurement currents in the range of $10^{-9}$ amps to $10^{-4}$ amps. The room temperature resistivities of PTCDA, NTCDA, and NiPc are shown as a function of dose in FIG. 1. For all films, we find $\rho$ is approximately proportional to $D^{-6}$ for $D < 1 \times 10^{16}$ cm$^{-2}$. Above this dose, the resistivity dependence flattens, indicating a "saturation" in the dependence of resistivity on D. Typically, $\rho$ varies over 13 orders of magnitude from its as-deposited value of $> 10^{10}$ ohm-cm to its saturated value of about $5 \times 10^{-4}$ ohm-cm. The sensitivity of NiPc is somewhat greater than for the other materials, where $\rho$ is about 100 times smaller for a given dose ($\leq 3 \times 10^{15}$ cm$^{-2}$) than for PTCDA and NTCDA. The saturation dose ($D_{sat}$) of $\rho$ is also smaller for NiPc ($D_{sat} = 10^{16}$ cm$^{-2}$) than for PTCDA and NTCDA ($D_{sat} > 5 \times 10^{16}$ cm$^{-2}$).

We interpret our results as follows: in the as-deposited state, the material is granular, with grain diameters of between 100 Angstroms and 500 Angstroms. The conductivity of the grains is low. In particular, conduction between grains is inhibited due to separations between molecules across the atomically large (perhaps 15–50 Angstroms) separation between grain pairs. The impact of an energetic Ar+ ion with a grain results in the breaking of chemical bonds within a cylinder whose axis is parallel to, and centered around, the path of the incident ion. We estimate that at least within a 10 Angstrom radius of the incident particle, the original molecular structure is destroyed by both the Ar+ ion and the secondary electrons generated on impact. Indeed, the energy deposited by a 2 MeV Ar+ ion through eletronic interactions is approximately 2 MeV per micrometer of film thickness. This results in the deposition of $> 20$ eV/atom for PTCDA (using the as-deposited film density of 1.69 gm/cm$^3$) within a diameter of 10 Angstroms, which is sufficient energy to break all bonds within that 10 Angstrom diameter cylinder. (In general, the deposition of about 3 times the binding energy is necessary to break bonds between atoms.) The impact also results in the loss of material. For example, in Rutherford backscattering experiments done on PTCDA, we have found that $> 70\%$ of the oxygen originally contained in the material is lost at $D = 10^{16}$ cm$^{-2}$.

Electron and X-ray diffraction experiments indicate that, at even moderate doses of ion beam irradiation, the polycrystalline structure of the as-deposited PTCDA is destroyed, leaving an amorphous film. The electron diffraction pattern of an irradiated PTCDA film, where $D = 10^{15}$ cm$^{-2}$, exhibits a broad amorphous line corresponding to an atomic spacing of about 2.25 Angstroms. As used hereafter, the term "substantially amorphous" means that as measured by electron beam diffraction, no structure is evident down to a resolution of 30 Angstroms, which is a typical resolution limit for most available electron beam diffraction apparatus. In addition, using improved electron beam diffraction techniques, we have determined that typically no structure is evident even down to the 10 Angstrom limit of the improved technique used. Finally, infrared and ultraviolet spectroscopy reveal that all of the molecular absorption peaks of the initial material are replaced, at doses of $D \geq 5 \times 10^{13}$ cm$^{-2}$, by a nearly featureless, slowly increasing absorption with decreasing wavelength in the UV to visible spectral region. These observations indicate that the material left after an ion impact has some similarities to amorphous carbon. The conductivity of the irradiated material, however, can be about $10^2$ times higher than amorphous carbon. Also, the resistivity $\rho(T)$ of amorphous carbon has been found to follow $\exp(\mathrm{const.}/T^{\frac{1}{4}})$, in contrast to our observations.

In contrast to an impact with a grain, an ion impact with a boundary may have little or no effect due to the paucity of bonds to be broken in this region. Thus, at a dose of about $10^{14}$ ions/cm$^{-2}$, nearly uniform irradiation has occurred with an average distance between adjacent impacts of roughly 10 Angstroms. We are then left with isolated conducting grains with $d \approx 200$ Angstroms to 500 Angstroms, and the resistivity of the material begins to drop from its as-deposited value of $\rho \geq 10^{10}$ ohm-cm due to charge hopping.

While the above materials are polycrystalline prior to irradiation, substantially similar reductions in resistivity are typically obtained in the case of irradiated single crystal or amorphous carbon-containing material. For example, PTCDA was deposited on a glass substrate under deposition conditions (primarily influenced by the spacing of the substrate relative to the source) that led to an amorphous film being deposited. Upon irradiation, the resistivity was reduced substantially as for the polycrystalline material above, as shown for PTCDA in FIG. 1. Thus, the particle radiation changed the film from an amorphous, relatively low conductivity state to an amorphous, higher conductivity state.

In addition to the above examples of irradiation of carbon-containing nonpolymers, numerous other carbon-containing nonpolymeric materials have been found to yield substantially similar results. In Table 1 below, the resistivity results are given for materials irradiated with 2 MeV argon ions, with resistivity measured at 300° Kelvin. The dose was $10^{16}$ ions/cm$^2$. Beneath each value of resistivity is given in parentheses and value of S* which gives a measure of sensitivity, and is defined as the ratio of the resistivity at a dose of $10^{15}$ ions/cm$^2$ to the resistivity at a dose of $10^{16}$ ions/cm$^2$.

TABLE 1

NONPOLYMERS
Resistivity ($\rho$) And Sensitivity S*
Measured At T = 300K, 2 MeV Ar+ Irradiation

| Material | $\rho(D = 10^{16})$ |
| --- | --- |
|  | (S* = $\rho(D = 10^{15})/\rho(D = 10^{16})$) |
| PcH$_2$ | $2 \times 10^{-3}$ |
| Phthalocyanine | (2440) |
| NiPc | $8 \times 10^{-4}$ |
| Ni phthalocyanine | (2500) |
| PTCDA | $8 \times 10^{-3}$ |
| 3,4,9,10-perylenetetra-carboxylic dianhydride | ($10^5$) |
| DIP | $4 \times 10^{-4}$ |
| Diindeno(1,2,3-cd:1'2'3'-lm) perylene | (3900) |
| PTCDI | $1 \times 10^{-3}$ |
| 3,4,9,10-Perylenetetra-carboxylic diimide | (2600) |
| CDA | $2 \times 10^{-3}$ |

TABLE 1-continued

NONPOLYMERS
Resistivity ($\rho$) And Sensitivity S*
Measured At T = 300K, 2 MeV Ar+ Irradiation

| | |
|---|---|
| 3,4-Coronenedicarboxylic anhydride | (8400) |
| CORN | $4 \times 10^{-3}$ |
| Coronene | (1000) |
| Perylene | $4.5 \times 10^{-3}$ |
| | (1100) |
| NA | $1.1 \times 10^{-2}$ |
| 1,8-Naphthalic anhydride | (160) |
| NTCDA | $1.5 \times 10^{-3}$ |
| 1,4,5,8-naphthalenetetra-carboxylic dianhydride | $(6.7 \times 10^4)$ |

In addition to the above results on nonpolymeric material, substantial reductions in resistivity have also been achieved with carbon-containing polymeric material.

EXAMPLE 2

Figure 2:
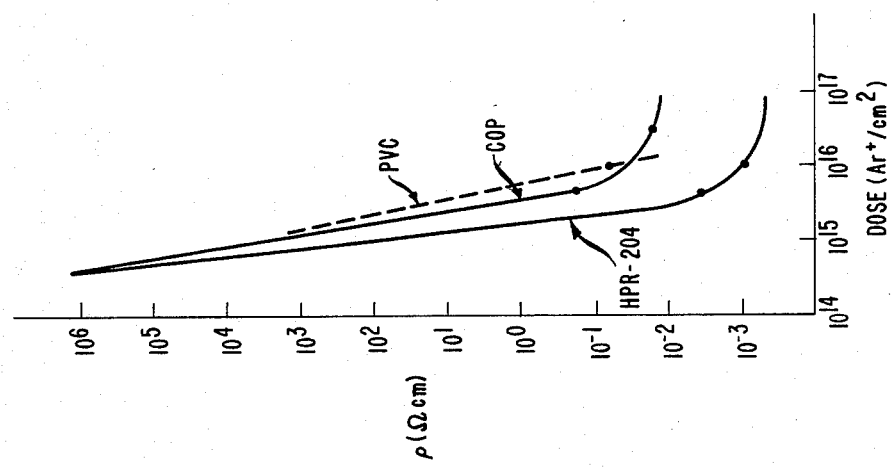
FIG. 2 shows the room temperature resistivity versus ion dose for certain polymeric materials.

The polymeric films PVC, COP, and HPR 204 were prepared by spinning the materials to a thickness of about 5,000 Angstroms onto glass substrates. The polymers were post baked at 100° C. for a period of 1 hour. The films were subsequently irradiated with a 2 MeV Ar+ ion beam of 1 mm diameter rapidly scanned through an aperture over an area of 0.1×0.5 cm on the sample. The charge collected on the target was integrated to measure the dose. The films were initially irradiated as above to improve adhesion to the substrate with a low dose of $10^{13}$ ions/cm² at low beam currents (10 nA) before commencing a high dose irradiation at convenient currents of a few hundred nA. In FIG. 2 is plotted the room temperature resistivity of these films as a function of the ion dose. The resistivity for HPR 204 drops to a value between $10^{-3}$ and $10^{-4}$ ohm-cm (characteristic of the limiting resistivity of amorphous metals) from a preirradiation value of $>10^{10}$ ohm-cm. In all cases, the resistivity decreases by several orders of magnitude over two to three orders of magnitude variation in dose ($10^{14}$–$10^{17}$ cm$^{-2}$).

The temperature dependence of the resistivity was measured and exhibits a $\rho = \rho_{oo} e^{(T_o/T)^{\frac{1}{2}}}$ behavior over a significant range of temperature. This effect is similar to that which has been observed for the foregoing organic anhydrides and pthalocyanine films.

TABLE 2

POLYMERS
Resistivity $\rho$ And Sensitivity S*
T = 300K 2 MeV Ar+

| Material | $\rho(D = 10^{16})$ |
|---|---|
| | (S* = $\rho(D = 10^{15}/D = 10^{16})$) |
| HPR 204 | $9 \times 10^{-4}$ |
| Cresol-formaldehyde resin | $(2 \times 10^5)$ |
| COP | $6 \times 10^{-2}$ |
| Poly(glicidyl methacrylate-co-ethyl acrylate) | $(3.3 \times 10^4)$ |
| PVC | $5 \times 10^{-2}$ |
| Poly(vinyl chloride) | $(1.2 \times 10^5)$ |

It appears that for polymers, the conductivity model above applies, where the ion beam irradiation generates the conducting islands, via the formation of material that includes amorphous carbon. The parameter $T_o$ in the exponent decreases with increasing dose. $T_o$ is related to s/d, where s and d are the mean values for the insulating separation and the conducting island size. This implies that increased ion beam irradiation results in the reduction of the insulating regions and an increased connectivity of the conducting islands, which effectively decreases s/d.

The ion beam induced conductivity in carbon-containing films is apparently a general phenomenon, not only true of the materials noted above, but also for most carbon-containing films. The ability to dramatically change the resistivity of carbon-containing films with particle irradiation, coupled with the fact that patterning with energetic particles is a viable technique, enables new technological capabilities. The high conductivity carbon form produced by ion beam bombardment is physically very unusual on account of the high conductivity despite the high amorphicity.

While the conductivity enhancing mechanism given above is postulated, other explanations are possible. The present invention does not rely on the exact model used to explain the observed effects. While the above experiments did not require heating the substrate, in fact significant heating, estimated to be about 200° C. at the highest dose levels, did occur. It is believed that this heating did enhance the effects noted, and external heating may increase the sensitivity of many materials.

The initial operation of irradiating the films at a low dose to improve adhesion may not be necessary in all cases. However, it has been found desirable for the materials above. Improved adhesion results from interatomic mixing at the irradiated material-substrate boundary. This requires an ion beam having sufficient energy so that the ions penetrate through this boundary. In addition, it has been found that the amount of irradiated material lost due to vaporization during the subsequent higher irradiation doses is reduced by the initial irradiation operation. Apparently, this is a result of changes in the structure of the irradiated material. We recommend an initial ion (or other particle) dose of $10^{12}$ to $10^{14}$ ions/cm² for this purpose.

In certain cases, especially when fine-line resolution is required at high ion doses, enhanced charge removal may be necessary, especially when a relatively nonconducting substrate supports the irradiated material. For this purpose, a film of conducting material may be used under, or on top of, the subject carbon-containing material. This conducting layer is then grounded; see, for example, U.S. Pat. No. 4,323,638, coassigned with the present invention. If the particles used for the irradiation are electrically neutral, then charge removal is typically not necessary.

While the use of argon ions has been shown above, other particles are possible. For example, 1 MeV helium ions (He+) have been used to irradiate PTCDA and NiPc films prepared as above. Also, 2 MeV Ne+ ions have been used on these materials. The results show a significant reduction in resistivity as before, with saturation values typically below $10^{-2}$ ohm-cm. However, somewhat higher doses are necessary as compared to 2 MeV Ar+ ions. We estimate that lighter particles (e.g., H+, He+) have a lower optimum kinetic energy, typically in the range of 10 kV to 1 MeV, as compared to heavier particles, for achieving maximum increase in conductivity. For argon, we estimate the most useful energies to be in the range of 100 keV to 10 MeV. Also, the energy can be chosen so that the particles do not penetrate the entire thickness of the carbon-containing material. This can be used to form conductors only in a surface region, or to avoid damage to a substrate, for example. Data showing the penetration distances of various ions of various energies are given in Nuclear Data Table, Vol. A-7, L. C. Morthcliffe and R. F. Schilling, page 233 (1970).

Siver contacts painted on each of the above irradiated materials have produced an ohmic (nonrectifying) contact in each case, as have the tungsten probes used for four point resistivity measurements, at least for material irradiated at a dose of $5 \times 10^{14}$ ions/cm$^2$ or greater. It thus appears that metallic electrical conductors in contact with the conductive material of the present invention typically produce ohmic contacts. While the irradiated material itself can be used as an electrical conductor in a circuit or device, it can also be used to form plated conductors for obtaining even lower resistivities. For example, with a relatively low resistivity irradiated region surrounded by a relatively high resistivity region, electroless or electrolytic plating processes can be used to deposit metal on the low resistivity region. Electroless solutions for plating copper, nickel, gold, cobalt, and palladium are known in the art, with still others being possible. With electrolytic techniques, an even wider range of materials can be deposited on the low resistivity irradiated material. In an electrolytic process, the irradiated low resistivity regions of the material can serve as an electrode of the plating process. Hybrid techniques are also possible; for example, an electroless process can first deposit a relatively thin layer on the irradiated regions of the material, which then serve as an electrode for a subsequent electrolytic deposition process.

While conducting lines produced in a film of carbon-containing material on a substrate are one application of the present technique, numerous other configurations are possible. For example, vertical contacts can be made through the film to a device or conductor beneath the film. The use of polyimides, silicones, or other carbon-containing materials to encapsulate integrated circuits, printed circuit boards, and other articles is known. A contact through the encapsulant is thus possible with the present technique. A metal conductor can be applied thereon, if desired, by evaporation, sputtering, plating, or other techniques known in the art.

All such applications relying on the teaching through which the present invention has advanced the art are within the spirit and scope of the present invention.

What is claimed is:

1. A method of making an article characterized by irradiating with particles having an atomic weight of at least 1, at least a portion of carbon-containing material having a resistivity greater than 1 ohm-cm prior to said irradiating, thereby essentially permanently reducing the resistivity of the irradiated portion of the material to less than 0.1 ohm-cm, due substantially to the formation of conducting amorphous-type carbon in said irradiated portion and not due to a possible presence of any metal in the article, with said irradiated portion of the material being adapted for use for the conduction of electrons.

2. The method of claim 1 wherein said material is an organic compound.

3. The method of claim 1 wherein said material is a polymeric material.

4. The method of claim 1 wherein said material is a nonpolymeric material.

5. The method of claim 1 wherein said material is a film on a substrate.

6. The method of claim 1 wherein said irradiating reduces the resistivity of the irradiated portion of the material to less than $10^{-2}$ ohm-cm.

7. The method of claim 1 wherein the initial resistivity of the carbon-containing material is greater than $10^{10}$ ohm-cm.

8. The method of claim 1 wherein said carbon-containing material prior to said irradiating is a material selected from the group consisting of single crystal material, polycrystalline material, and polymeric material, whereby said irradiating converts the irradiated portion of the material to a substantially amorphous material.

9. The method of claim 1 wherein said irradiating is selectively applied to said material, whereby one or more irradiated regions are at least partially surrounded by nonirradiated regions of said material following said irradiating.

10. The method of claim 1 wherein said particles are argon ions.

11. The method of claim 10 wherein said argon ions have an energy in the range of 100,000 to 10,000,000 electron volts.

12. An article made according to the method of claim 1, 2, 3, 4, 5, 6, 7, 8, 9, 10, or 11.

* * * * *

UNITED STATES PATENT AND TRADEMARK OFFICE
CERTIFICATE OF CORRECTION

PATENT NO. : 4,511,445

DATED : April 16, 1985

INVENTOR(S) : Stephen R. Forrest, Martin L. Kaplan, Paul H. Schmidt and Thirumalai N. C. Venkatesan It is certified that error appears in the above-identified patent and that said Letters Patent is hereby corrected as shown below:

Column 3, line 14, "cm-2" should read --$cm^{-2}$--.

Signed and Sealed this

Seventh Day of January 1986

[SEAL]

*Attest:*

DONALD J. QUIGG

*Attesting Officer*  *Commissioner of Patents and Trademarks*